(12) United States Patent
Kwon et al.

(10) Patent No.: US 9,293,514 B2
(45) Date of Patent: Mar. 22, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Do-Hyun Kwon, Gyeonggi-Do (KR); Il-Jeong Lee, Gyeonggi-Do (KR); Choong-Youl Im, Gyeonggi-Do (KR); Ju-Won Yoon, Gyeonggi-Do (KR); Moo-Soon Ko, Gyeonggi-Do (KR); Min-Woo Woo, Gyeonggi-Do (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 161 days.

(21) Appl. No.: 14/097,420

(22) Filed: Dec. 5, 2013

(65) Prior Publication Data

US 2015/0014638 A1  Jan. 15, 2015

(30) Foreign Application Priority Data

Jul. 12, 2013  (KR) .................. 10-2013-0082152

(51) Int. Cl.
| | |
|---|---|
| H01L 29/40 | (2006.01) |
| H01L 23/52 | (2006.01) |
| H01L 23/48 | (2006.01) |
| H01L 27/32 | (2006.01) |
| H01L 29/786 | (2006.01) |
| H01L 27/12 | (2006.01) |

(52) U.S. Cl.
CPC ........ H01L 27/3265 (2013.01); H01L 27/1237 (2013.01); H01L 29/78645 (2013.01)

(58) Field of Classification Search
CPC ... H01L 27/124; H01L 27/1255; H01L 27/32; H01L 27/3258; H01L 27/3262; H01L 27/3265; H01L 27/3246; H01L 27/326; H01L 2227/323; H01L 2251/5315; H01L 2251/5338; H01L 2251/568; H01L 51/5036; H01L 51/5253
USPC ............ 257/40, 642, 759, E51.003, E51.018, 257/51.022, E51.025
See application file for complete search history.

(56) References Cited

U.S. PATENT DOCUMENTS

| | | | |
|---|---|---|---|
| 2007/0194326 | A1* | 8/2007 | Huh ................................ 257/79 |
| 2012/0098008 | A1* | 4/2012 | Song .................. H01L 27/3258 257/98 |

FOREIGN PATENT DOCUMENTS

| | | |
|---|---|---|
| KR | 1020050122894 | 12/2005 |
| KR | 1020090058283 | 6/2009 |

* cited by examiner

*Primary Examiner* — Kyoung Lee
*Assistant Examiner* — Joannie A Garcia
(74) *Attorney, Agent, or Firm* — F. Chau & Associates, LLC (57) ABSTRACT

An organic light emitting diode (OLED) display includes a scan line, a data line, a driving voltage line, a switching transistor, a driving transistor and an OLED. The scan line is formed on a substrate to transmit a scan signal. The data line and the driving voltage line, intersecting the scan line, transmit a data signal and a driving voltage, respectively. The switching transistor, electrically coupled to the scan line and the data line, includes a switching semiconductor layer, a switching gate electrode, and a gate insulating layer having a first thickness. The driving transistor, electrically coupled to the switching drain electrode, includes a driving semiconductor layer, a driving gate electrode and a gate insulating layer having a second thickness. The OLED is electrically coupled to the driving drain electrode. The data line and the driving voltage line are formed with different layers from each other.

12 Claims, 5 Drawing Sheets

ORGANIC LIGHT EMITTING DIODE DISPLAY

CROSS-REFERENCE TO RELATED APPLICATION

This application claims priority under 35 U.S.C. 119 to Korean Patent Application No. 10-2013-0082152, filed on Jul. 12, 2013 in the Korean Intellectual Property Office, the disclosure of which is incorporated by reference herein in its entirety.

TECHNICAL FIELD

The present invention relates to an organic light emitting diode (OLED) display.

DISCUSSION OF RELATED ART

Organic light emitting diode (OLED) displays include pixels emitting light using self-emissive organic emission layers. Holes and electrons injected to organic emission layers are combined to generate excitons. Such excitions emit light when discharging energy. As the resolution of the organic light emitting diode (OLED) display increases, the size of each pixel is decreased.

SUMMARY

According to an exemplary embodiment of the present invention, an organic light emitting diode (OLED) display includes a scan line, a data line, a driving voltage line, a switching transistor, a driving transistor and an OLED. The scan line is formed on a substrate to transmit a scan signal. The data line and the driving voltage line intersect the scan line and are configured to transmit a data signal and a driving voltage, respectively. The switching transistor is electrically coupled to the scan line and the data line. The switching transistor includes a switching semiconductor layer, a switching gate electrode, and a gate insulating layer having a first thickness. The driving transistor is electrically coupled to the switching drain electrode of the switching transistor. The driving transistor includes a driving semiconductor layer, a driving gate electrode and a gate insulating layer having a second thickness. The organic light emitting diode (OLED) is electrically coupled to the driving drain electrode of the driving transistor. The data line and the driving voltage line are formed with different layers from each other.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF THE EMBODIMENTS

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, an organic light emitting diode display according to an exemplary embodiment of the present invention will be described in detail with reference to FIG. 1 to FIG. 5.

Figure 1:
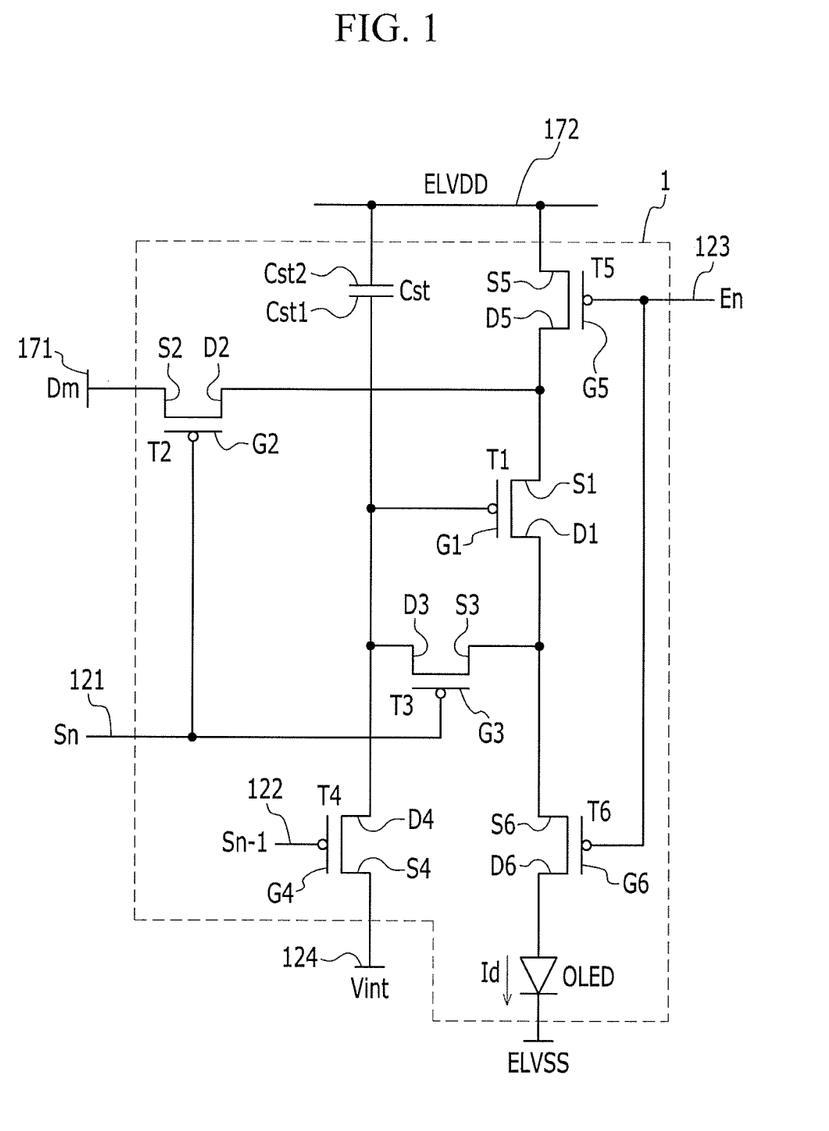
FIG. 1 is a circuit diagram illustrating a pixel of an organic light emitting diode display according to an exemplary embodiment of the present invention.

FIG. 1 is a circuit diagram of a pixel of an organic light emitting diode display according to an exemplary embodiment of the present invention.

Referring to FIG. 1, a pixel 1 includes a plurality of signal lines 121, 122, 123, 124, 171, and 172, and a plurality of transistors T1, T2, T3, T4, T5, and T6, a storage capacitor Cst, and an organic light emitting diode (OLED).

Hereinafter, the transistor T1 may be referred to as a driving transistor (driving thin film transistor) T1. The transistor T2 may be referred to as a switching transistor (switching thin film transistor) T2. The transistor T3 may be referred to as a compensation transistor T3. The transistor T4 may be referred to as an initialization transistor T4. The transistor T5 may be referred to as an operation control transistor T5. The transistor T6 may be referred to as a light emission control transistor T6.

The signal line 121 may be referred to as a scan line 121 for transferring a scan signal Sn. The signal line 122 may be referred to as a prior scan line 122 for transferring a prior scan signal Sn−1 to the initialization transistor T4. The signal line 123 may be referred to as a light emission control line 123 for transferring a light emission control signal En to the operation control transistor T5 and the light emission control transistor T6. The signal line 171 may be referred to as a data line 171 for transferring a data signal Dm. The signal line 172 may be referred to as a driving voltage line 172 for transferring a driving voltage ELVDD. The signal line 124 may be referred to as an initialization voltage line 124 for transferring an initialization voltage Vint. The initialization voltage Vint serves to initialize the driving transistor T1.

A gate electrode G1 of the driving transistor T1 is connected to a first electrode Cst1 of the storage capacitor Cst, a source electrode S1 of the driving transistor T1 is connected via the operation control transistor T5 to the driving voltage line 172, and the drain electrode D1 of the driving transistor T1 is electrically connected via the light emission control transistor T6 to an anode of the organic light emitting diode (OLED). The driving transistor T1 receives the data signal Dm according to a switching operation of the switching transistor T2 to supply a driving current Id to the organic light emitting diode (OLED).

A gate electrode G2 of the switching transistor T2 is connected to the scan line 121, a source electrode S2 of the switching transistor T2 is connected to the data line 171, and a drain electrode D2 of the switching transistor T2 is connected to the source electrode S1 of the driving transistor T1 and connected via the operation control transistor T5 to the driving voltage line 172. The switching transistor T2 serves to transfer the data signal Dm, according to the scan signal Sn, to the source electrode of the driving transistor T1.

A gate electrode G3 of the compensation transistor T3 is connected to the scan line 121, a source electrode S3 of the compensation transistor T3 is connected to the drain electrode D1 of the driving transistor T1 and connected via the light emission control transistor T6 to the anode of the organic light emitting diode (OLED), and a drain electrode D3 of the compensation transistor T3 is connected to the first electrode Cst1 of the storage capacitor Cst, a drain electrode D4 of the initialization transistor T4, and the gate electrode G1 of the driving transistor T1. The compensation transistor T3 is turned on according to the scan signal Sn transferred through the scan line 121 to connect the gate electrode G1 and the drain electrode D1 of the driving transistor T1 to each other, thus rendering the driving transistor T1 to performing as a diode.

A gate electrode G4 of the initialization transistor T4 is connected to the prior scan line 122, the source electrode S4 of the initialization transistor T4 is connected to the initialization voltage line 124, and the drain electrode D4 of the initialization transistor T4 is connected to the first electrode Cst1 of the storage capacitor Cst, the drain electrode D3 of the compensation transistor T3, and the gate electrode G1 of the driving transistor T1. The initialization transistor T4 is turned on according to the prior scan signal Sn−1 transferred through the prior scan line 122 to transfer the initialization voltage Vint to the gate electrode G1 of the driving transistor T1, thus initializing the voltage of the gate electrode G1 of the driving transistor T1 to the initialization voltage Vint.

A gate electrode G5 of the operation control transistor T5 is connected to the light emission control line 123, a source electrode S5 of the operation control transistor T5 is connected to the driving voltage line 172, and a drain electrode D5 of the operation control transistor T5 is connected to the source electrode S1 of the driving transistor T1 and the drain electrode D2 of the switching transistor T2.

A gate electrode G6 of the light emission control transistor T6 is connected to the light emission control line 123, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode (OLED). The operation control transistor T5 and the light emission control transistor T6 are simultaneously turned on according to the light emission control signal En transferred through the light emission control line 123 to transfer the driving voltage ELVDD to the organic light emitting diode (OLED), thus allowing the driving current Id to flow through the organic light emitting diode (OLED).

A second electrode Cst2 of the storage capacitor Cst is connected to the driving voltage line 172, and a cathode of the organic light emitting diode (OLED) is connected to a common voltage ELVSS. Accordingly, the organic light emitting diode (OLED) receives the driving current Id from the driving transistor T1 to emit light, thereby displaying an image.

Hereinafter, an operation of a pixel of an organic light emitting diode display according to an exemplary embodiment of the present invention will be described in detail.

First, the prior scan signal Sn−1 at a low level is supplied through the prior scan line 122 during an initialization period. Then, the initialization transistor T4 is turned on in response to the prior scan signal Sn−1 at the low level, and the initialization voltage Vint is connected from the initialization voltage line 124 through the initialization transistor T4 to the gate electrode of the driving transistor T1 to initialize the driving transistor T1 using the initialization voltage Vint.

Subsequently, the scan signal Sn at the low level is supplied through the scan line 121 during a data programming period. Then, the switching transistor T2 and the compensation transistor T3 are turned on in response to the scan signal Sn at the low level.

In this case, the driving transistor T1 is diode-connected by the turned-on compensation transistor T3, and is biased in a forward direction.

Then, a compensation voltage Dm+Vth is applied to the gate electrode of the driving transistor T1 to prevent a threshold voltage drop across the driving transistor T1. The Vth is a threshold voltage of the driving transistor T1 and has a negative voltage.

The driving voltage ELVDD and the compensation voltage Dm+Vth are applied to respective electrodes of the storage capacitor Cst, and a charge corresponding to a voltage difference between the respective electrodes is stored in the storage capacitor Cst. Thereafter, the level of the light emission control signal En supplied from the light emission control line 123 during the light emission period is changed from the high level to the low level. Then, the operation control transistor T5 and the light emission control transistor T6 are turned on by the light emission control signal En at the low level during the light emission period.

Subsequently, the driving current Id supplied to the organic light emitting diode (OLED) corresponds to a voltage difference between the gate electrode of the driving transistor T1 and the driving voltage ELVDD. A gate-source voltage Vgs of the driving transistor T1 is maintained at "(Dm+Vth)−ELVDD" using the storage capacitor Cst during the light emission period. The driving current Id is proportional to a square of a difference between the threshold voltage and the source-gate voltage of the driving transistor T1, that is, "$(Dm-ELVDD)^2$", according to a current-voltage relationship of the driving transistor T1. Accordingly, the driving current Id is determined regardless of the threshold voltage Vth of the driving transistor T1.

Now, a detailed structure of the pixel of the organic light emitting diode display illustrated in FIG. 1 will be described in detail with reference to FIGS. 2 to 5 together with FIG. 1.

Figure 2:
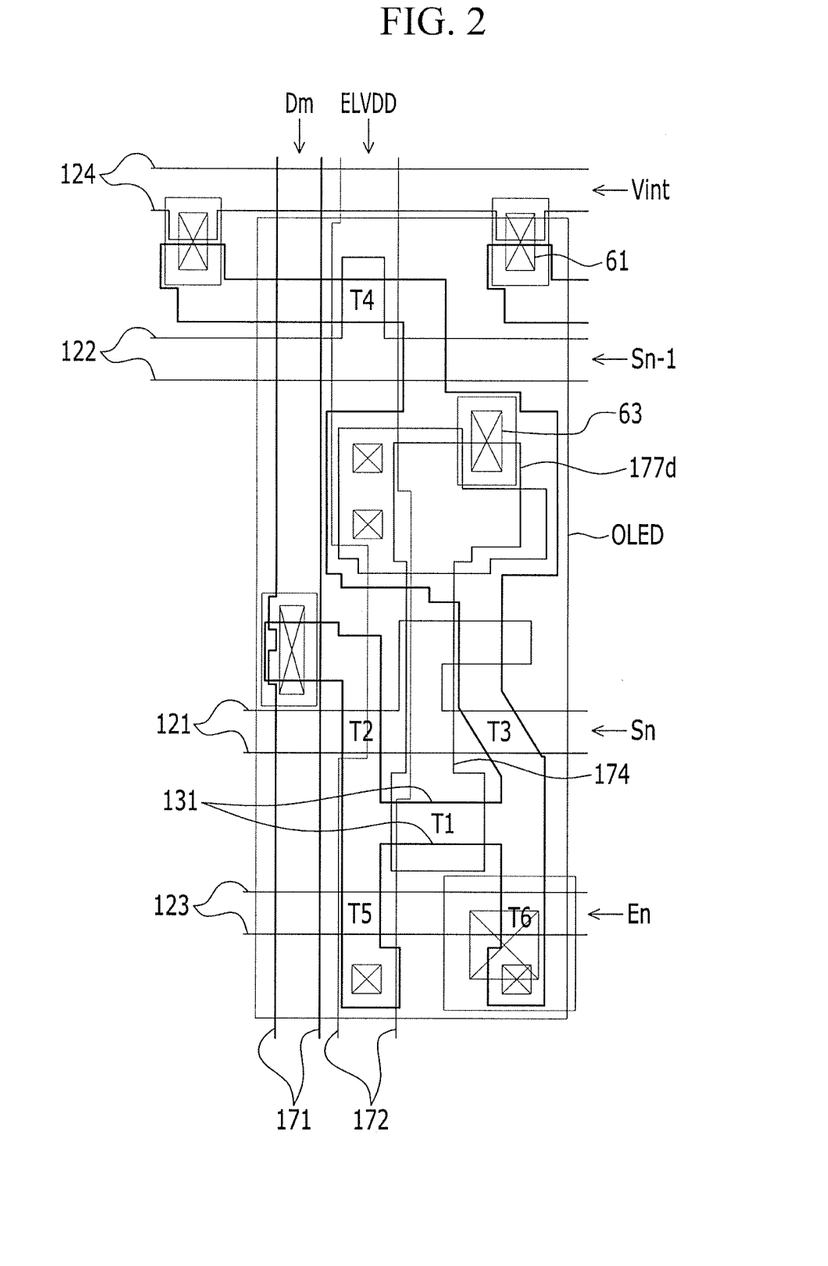
FIG. 2 is a layout illustrating a pixel according to an exemplary embodiment of the present invention.
Figure 3:
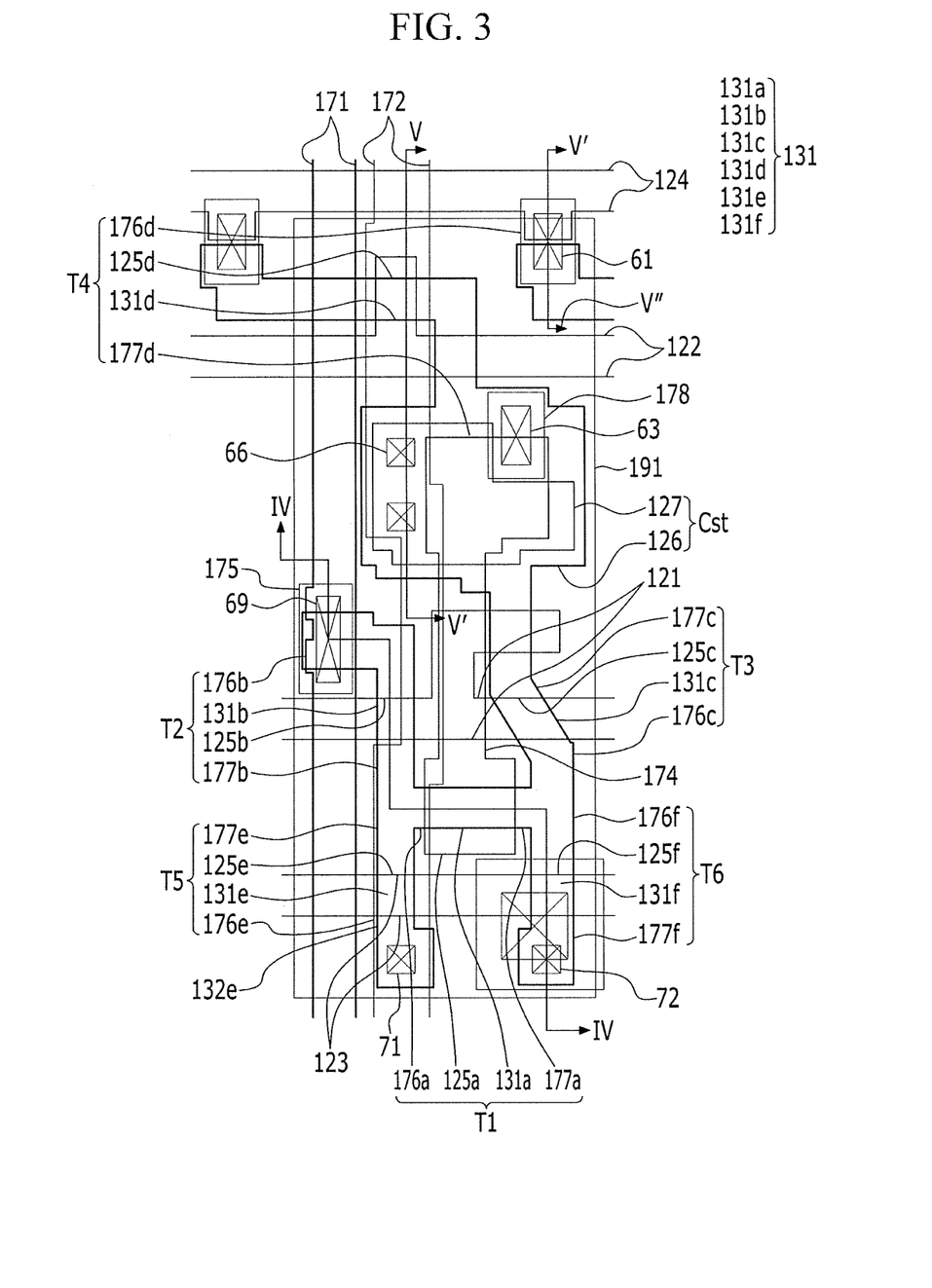
FIG. 3 is a layout illustrating a pixel according to an exemplary embodiment of the present invention.
Figure 4:
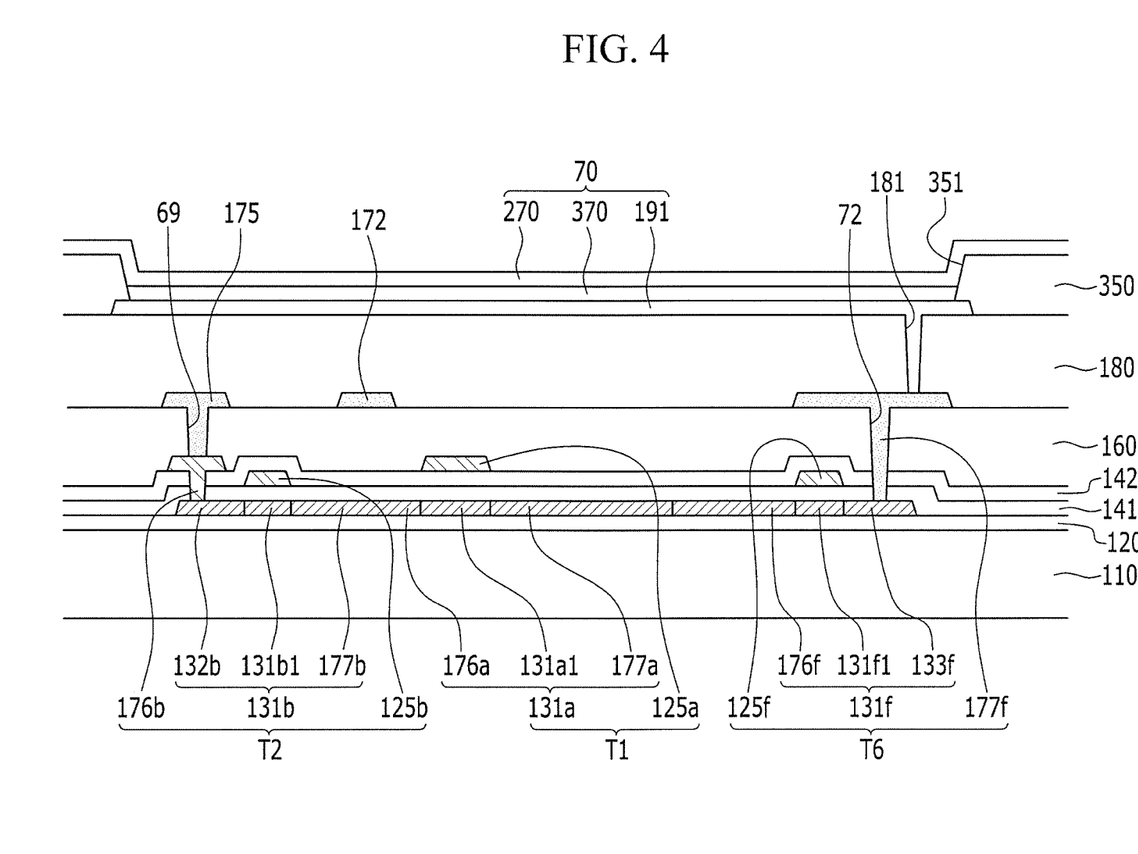
FIG. 4 is a cross-sectional view taken along line IV-IV of the organic light emitting diode display of FIG. 3.
Figure 5:
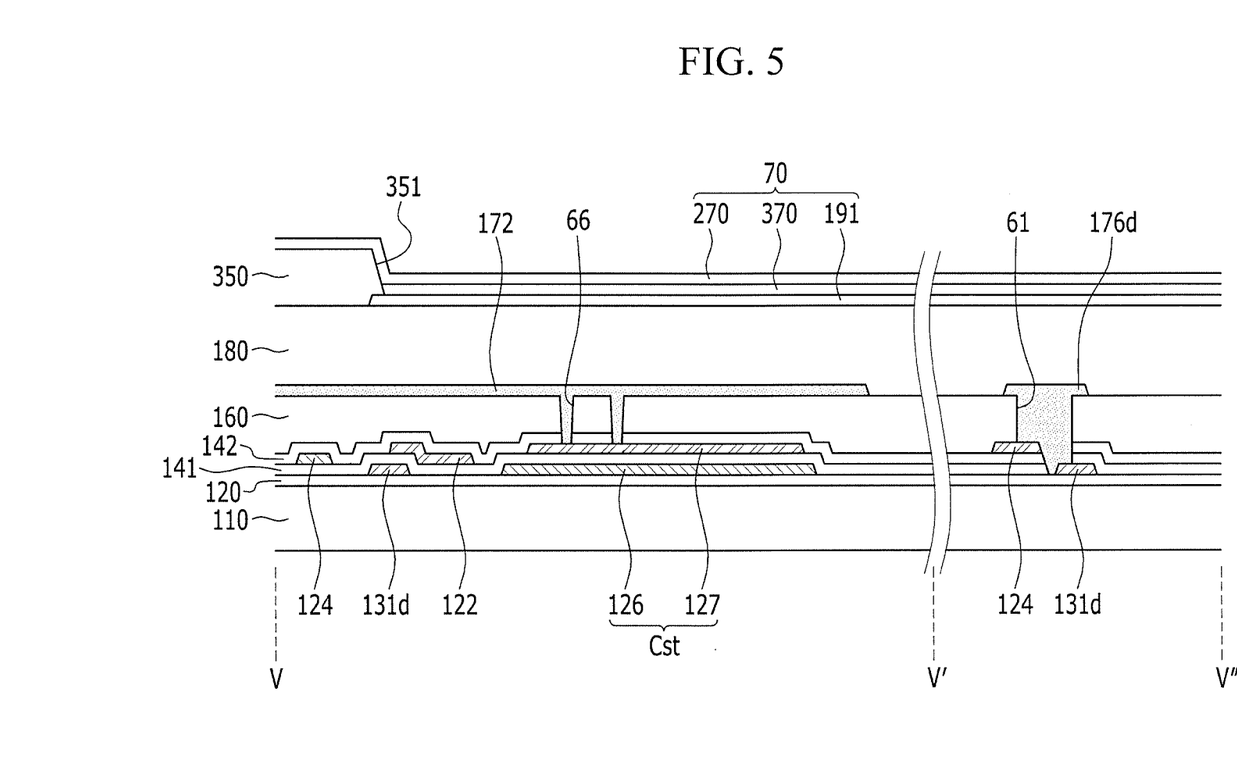
FIG. 5 is a cross-sectional view taken along lines V-V' and V'-V" of the organic light emitting diode display of FIG. 3.

FIGS. 2 and 3 are layouts illustrating a pixel according to an exemplary embodiment of the present invention, FIG. 4 is a cross-sectional view, taken along line IV-IV, of the organic light emitting diode display of FIG. 3, which is, and FIG. 5 is a cross-sectional view, taken along lines V-V' and V'-V", of the organic light emitting diode display of FIG. 3.

Referring to FIG. 2, an organic light emitting diode display according to an exemplary embodiment of the present invention includes a scan line 121, a prior scan line 122, a light emission control line 123, and an initialization voltage line 124 applying a scan signal Sn, a prior scan signal Sn−1, a light emission control signal En, and an initialization voltage Vint, respectively. The signal lines 121, 122, 123 and 124 are extended in a row direction. A data line 171 and a driving voltage line 172 cross the signal lines 121 to 124. The data line 171 and the driving voltage line 172 apply a data signal Dm and a driving voltage ELVDD, respectively, to the pixel.

Further, the driving transistor T1, the switching transistor T2, the compensation transistor T3, the initialization transistor T4, the operation control transistor T5, the light emission control transistor T6, the storage capacitor Cst, and the organic light emitting diode (OLED) are formed in the pixel.

The driving transistor T1, the switching transistor T2, the compensation transistor T3, the initialization transistor T4, the operation control transistor T5, and the light emission control transistor T6 are formed along a semiconductor layer 131. The semiconductor layer 131 is formed to be bent in various shapes. The semiconductor layer 131 may be formed of polysilicon or an oxide semiconductor. The oxide semiconductor may include oxides having titanium (Ti), hafnium (Hf), zirconium (Zr), aluminum (Al), tantalum (Ta), germanium (Ge), zinc (Zn), gallium (Ga), tin (Sn), indium (In), or a mixture thereof. For example, the oxide semiconductor may include, but is not limited to, zinc oxide (ZnO), indium-gallium-zinc oxide (InGaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O). In the case where the semiconductor layer 131 is formed of an oxide semiconductor, a protective layer may be formed on the semiconductor layer 131 to protect the oxide semiconductor that is weak to an external environment such as high temperatures.

The semiconductor layer 131 includes a channel region that is subject to channel doping with an N-type impurity or a P-type impurity, and a source region and a drain region that are formed at respective sides of the channel region and formed by doping a doping impurity having a type that is opposite to that of the doping impurity doped in the channel region.

Hereinafter, a layout of an organic light emitting diode display according to an exemplary embodiment of the present invention will be described in detail with reference to FIGS. 2 and 3, and a cross-sectional structure thereof will be described in detail with reference to FIGS. 4 and 5.

First, referring to FIGS. 2 and 3, a pixel of an organic light emitting diode display according to an exemplary embodiment of the present invention includes the driving transistor T1, the switching transistor T2, the compensation transistor T3, the initialization transistor T4, the operation control transistor T5, the light emission control transistor T6, the storage capacitor Cst, and the organic light emitting diode (OLED). The transistors T1, T2, T3, T4, T5, and T6 are formed along the semiconductor layer 131. The semiconductor layer 131 includes a driving semiconductor layer 131a formed in the driving transistor T1, a switching semiconductor layer 131b formed in the switching transistor T2, a compensation semiconductor layer 131c formed in the compensation transistor T3, an initialization semiconductor layer 131d formed in the initialization transistor T4, an operation control semiconductor layer 131e formed in the operation control transistor T5, and a light emission control semiconductor layer 131f formed in the light emission control transistor T6.

The driving transistor T1 includes the driving semiconductor layer 131a, a driving gate electrode 125a, a driving source electrode 176a, and a driving drain electrode 177a. The driving semiconductor layer 131a includes a driving channel region overlapped with the driving gate electrode 125a. The driving semiconductor layer 131a also includes a driving source region 176a corresponding to the driving source electrode 176a and a driving drain region 177a corresponding to the driving drain electrode 177a. The driving source region 176a is formed at one side of the channel region of the driving semiconductor layer 131a. The driving source region 176a is doped with impurities in the driving semiconductor layer 131a. The driving drain region 177a is formed at the other side of the channel region of the driving semiconductor layer 131a. The driving drain region 177a is doped with impurities in the driving semiconductor layer 131a. The driving gate electrode 125a is formed with substantially the same material as that of the data line 171 and a connection member 174. For example, the driving gate electrode 125a, the data line 171, and the connection member 174 may be simultaneously formed using substantially the same material.

The switching transistor T2 includes the switching semiconductor layer 131b, a switching gate electrode 125b, a switching source electrode 176b, and a switching drain electrode 177b. The switching semiconductor layer 131b includes a switching channel region overlapped with the switching gate electrode 125b. The switching semiconductor layer 131b also includes a switching source region corresponding to the switching source electrode 176b and a switching drain region corresponding to the switching drain electrode 177b. The switching source electrode 176b is connected to the data line 171 through a contact hole 69. The switching drain region 177b is doped with impurity in the switching semiconductor layer 131b.

The switching gate electrode 125b is formed with substantially the same material as the scan line 121, the prior scan line 122, the light emission control line 123, the initialization voltage line 124, a compensation gate electrode 125c, an initialization gate electrode 125d, an operation control gate electrode 125e, a light emission control gate electrode 125f, and a second storage capacitive plate 127. For example, the switching gate electrode 125b, the scan line 121, the prior scan line 122, the light emission control line 123, the initialization voltage line 124, a compensation gate electrode 125c, an initialization gate electrode 125d, an operation control gate electrode 125e, a light emission control gate electrode 125f, and a second storage capacitive plate 127 may be simultaneously formed using substantially the same material.

The compensation transistor T3 includes the compensation semiconductor layer 131c, the compensation gate electrode 125c, a compensation source electrode 176c, and a compensation drain electrode 177c. The compensation semiconductor layer 131c includes a compensation channel region overlapped with the compensation gate electrode 125c. The compensation semiconductor layer 131c also includes a compensation source region 176c corresponding to the compensation source electrode 176c and a compensation drain region corresponding to the compensation drain electrode 177c. The initialization transistor T4 includes the initialization semiconductor layer 131d, the initialization gate electrode 125d, an initialization source electrode 176d, and an initialization drain electrode 177d. The initialization semiconductor layer 131d includes an initialization channel region overlapped with the initialization gate electrode 125d. The initialization gate electrode 125d is part of the prior scan line 122. The initialization semiconductor 131d also includes an initialization source region corresponding to the initialization source electrode 176d and an initialization drain region corresponding to the initialization drain electrode 177d. The initialization source electrode 176d is connected through a contact hole 61 to the initialization source region that is formed at one side of the initialization gate electrode 125d. The initialization drain electrode 177d is connected through a contact hole 63 to the initialization drain region that is formed at the other side of the initialization gate electrode 125d.

The operation control transistor T5 includes the operation control semiconductor layer 131e, the operation control gate electrode 125e, an operation control source electrode 176e, and an operation control drain electrode 177e. The operation control semiconductor layer 131e includes an operation control channel region overlapped with the operation control source electrode 176e. The operation control source electrode 176e is part of the driving voltage line 172 and is connected to an operation control source region 132e through a contact hole 71. The operation control drain electrode 177e corresponds to an operation control drain region 177e doped with impurities in the operation control semiconductor layer 131e.

The light emission control transistor T6 includes the light emission control semiconductor layer 131f, the light emission control gate electrode 125f, a light emission control source electrode 176f, and a light emission control drain electrode 177f. The light emission control semiconductor layer 131f includes a light emission control channel region overlapped with the light emission control gate electrode 125f. The light emission control gate electrode 125 is part of the light emission control line 123. The light emission control semiconductor layer 131f also includes a light emission control source region corresponding to the light emission control source electrode 176f and a light emission control drain region corresponding to the light emission control drain electrode 177f. The light emission control source region 176f is doped with impurities in the light emission control semiconductor layer 131f.

An end of the driving semiconductor layer 131a of the driving transistor T1 is connected to the switching semiconductor layer 131b and the operation control semiconductor layer 131e, and another end of the driving semiconductor layer 131a is connected to the compensation semiconductor layer 131c and the light emission control semiconductor layer 131f. Therefore, the driving source electrode 176a is connected to the switching drain electrode 177b and the operation control drain electrode 177e, and the driving drain electrode 177a is connected to the compensation source electrode 176c and the light emission control source electrode 176f.

The storage capacitor Cst includes a first storage capacitive plate 126, the second storage capacitive plate 127, and a dielectric oxide layer interposed therebetween. For example, the dielectric oxide layer may correspond to a first gate insulating layer 141 of FIGS. 4 and 5, which will be described later. The first storage capacitive plate 126 is formed with substantially the same material as the semiconductor layer 131. For example, the first storage capacitive plate 126 and the semiconductor layer 131 may be simultaneously formed. The second storage capacitive plate 127 is formed with substantially the same material as the scan line 121, the prior scan line 122, the light emission control line 123, the initialization voltage line 124, the switching gate electrode 125b, the compensation gate electrode 125c, the initialization gate electrode 125d, the operation control gate electrode 125e, and the light emission control gate electrode 125f. For example, the second storage capacitive plate 127, the scan line 121, the prior scan line 122, the light emission control line 123, the initialization voltage line 124, the switching gate electrode 125b, the compensation gate electrode 125c, the initialization gate electrode 125d, the operation control gate electrode 125e, and the light emission control gate electrode 125f may be simultaneously formed.

Herein, a storage capacitance is determined by charges accumulated in the storage capacitor Cst and a voltage between both capacitive plates 126 and 127.

The driving voltage line 172 overlapping and passing the storage capacitor Cst overlaps and passes the scan line 121, the prior scan line 122, the light emission control line 123, and the initialization voltage line 124. A portion of the driving voltage line 172 corresponds to the operation control source electrode 176e and is connected to the operation control source region 132e through the contact hole 71, and another portion of the driving voltage line 172 is connected to the second storage capacitive plate 127 through a contact hole 66. The contact hole 66 may be formed in the interlayer insulating layer 160 and the second gate insulating layer 142, which will be described later with reference to FIGS. 4 and 5.

The connection member 174 parallel to the driving voltage line 172 is formed with substantially the same layer as the data line 171. The connection member 174 connects the driving gate electrode 125a and the firstd storage capacitive plate 126 to each other. A sub connection member 178 is formed with substantially the same layer as the driving voltage line 172. The sub connection member 178 is connected through a contact hole 63 to both the firstd storage capacitive plate 126 and the connection member 174.

Accordingly, the storage capacitor Cst stores a storage capacitance corresponding to the voltage difference between the driving voltage ELVDD transmitted through the driving voltage line 172 and the gate voltage of the driving gate electrode 125a.

The switching transistor T2 is used as a switching element selecting a pixel to emit light. The switching gate electrode 125b is connected to the scan line 121, the switching source electrode 176b is connected to the data line 171, and the switching drain electrode 177b is connected to the driving transistor T1 and the operation control transistor T5. In addition, the light emission control drain electrode 177f of the light emission control transistor T6 is directly connected through a contact hole 181 formed in a protective layer 180 to a pixel electrode 191 of an organic light emitting diode 70. The contact hole 181 and the pixel electrode 191 will be described later with reference to FIGS. 4 and 5.

Referring to FIG. 4 and FIG. 5, a structure of an organic light emitting diode (OLED) display according to an exemplary embodiment of the present invention will be described.

A vertical structure of the transistors T1, T2 and T6 of FIG. 3 will be described. A vertical structure of the compensation transistor T3 and the initialization transistor T4 may have substantially the same as that of the switching transistor T2, and a vertical structure of the operation control transistor T5 may have substantially the same as that of the light emission control transistor T6.

A buffer layer 120 is formed on a substrate 110. The substrate 110 may be formed of an insulating substrate including, but is not limited to, glass, quartz, ceramics, plastics, or the like.

The driving semiconductor layer 131a, the switching semiconductor layer 131b, the light emission control semiconductor layer 131f, and the first storage capacitive plate 126 are formed on the buffer layer 120. The driving semiconductor layer 131a includes a driving channel region 131a1, the driving source region 176a and the driving drain region 177a. The driving channel region 131a1 is interposed between the driving source region 176a and the driving drain region 177a. The switching semiconductor layer 131b includes a switching channel region 131b1, the switching source region 132b, and the switching drain region 177b. The switching channel region 131b1 is interposed between the switching source region 132b and the switching drain region 177b. The light emission control transistor T6 includes a light emission control channel region 131f1, the light emission control source region 176f, and a light emission control drain region 133f. The light emission control channel region 131f1 is interposed between the light emission control source region 176f and a light emission control drain region 133f.

The first gate insulating layer 141 is formed on the switching semiconductor layer 131a, the driving semiconductor layer 131b, and the light emission control semiconductor layer 131f. The first gate insulating layer 141 is formed of a high dielectric constant material including, but is not limited to, HfOx, ZrOx, AlOx, or SiOx.

The first gate wires 121, 122, 123, 124, 125b, 125f, and 127 including the scan line 121 including the switching gate electrode 125b, the prior scan line 122, the light emission control line 123 including the light emission control gate electrode 125f, the initialization voltage line 124, and the second storage capacitive plate 127 are formed on the first gate insulating layer 141. The signal lines 121, 122, 123, 124, 125b, 125f, and 127 may be collectively referred to as first gate wires.

The second gate insulating layer 142 is formed on the first gate wires 121, 122, 123, 124, 125b, 125f, and 127 and the first gate insulating layer 141. The second gate insulating layer 142 is formed of silicon nitride (SiNx) or silicon oxide (SiO2).

The driving gate electrode 125a and the data line 171 are formed on the second gate insulating layer 142. The driving gate electrode 125a and the data line 171 may be collectively referred to as second gate wires.

As described above, the first gate insulating layer 141 and the second gate insulating layer 142 are formed between the driving semiconductor layer 131a and the driving gate electrode 125a, and thus the driving transistor T1 having a gate insulating layer thicker than other transistors of the pixel 1. The first gate insulating layer 141 and the second gate insulating layer 142 constitutes the gate insulating layer of the driving transistor T1. Accordingly, the gate voltage applied to the driving gate electrode 125a is increased to higher voltages, thereby the pixel 1 displaying various grayscales.

The storage capacitance of the storage capacitor Cst may be increased using the first gate insulating layer 141 made of a high dielectric constant material.

Also, by forming the data line 171 with the same layer as the driving gate electrode 125a, the data line 171 is formed with a different layer from the driving voltage line 172 such that the data line 171 and the driving voltage line 172 may overlap, thereby implementing a high resolution display.

The interlayer insulating layer 160 is formed on the second gate wires 125a and 171 and the second gate insulating layer 142. The interlayer insulating layer 160 may be made of a ceramic-based material including, but is not limited to, silicon nitride (SiNx) or silicon oxide (SiO2).

The driving voltage line 172, the switching connection plate 175, and the light emission control drain electrode 177f are formed on the interlayer insulating layer 160. The data wires 172, 175, and 177f may be collectively referred to as data wires.

The light emission control drain electrode 177f is connected through a contact hole 72 formed in the first gate insulating layer 141, the second gate insulating layer 142, and the interlayer insulating layer 160 to the light emission control drain region 133f of the light emission control semiconductor layer 131f.

The protective layer 180 is formed on the data wires 172, 175, and 177f. The pixel electrode 191 is formed on the protective layer 180. The pixel electrode 191 is connected to the light emission control drain electrode 177f through the contact hole 181 formed in the protective layer 180.

A barrier rib 350 is formed on an edge of the pixel electrode 191 and the protective layer 180, and the barrier rib 350 has a barrier rib opening 351 through which the pixel electrode 191 is exposed. The barrier rib 350 may be made of resins including, but is not limited to, polyacrylates and polyimides, or silica-based inorganic materials.

An organic emission layer 370 is formed on the pixel electrode 191 exposed through the barrier rib opening 351, and a common electrode 270 is formed on the organic emission layer 370. As described above, the organic light emitting diode 70 including the pixel electrode 191, the organic emission layer 370, and the common electrode 270 is formed.

Herein, the pixel electrode 191 is an anode that is a hole injection electrode, and the common electrode 270 is a cathode that is an electron injection electrode. However, the pixel electrode 191 may be a cathode and the common electrode 270 may be an anode according to a driving method of the organic light emitting diode display. Holes and electrons are injected from the pixel electrode 191 and the common electrode 270 into the organic emission layer 370, and when excitons that are formed of the injected holes and electrons fall from an exited state to a ground state, light is emitted.

The organic emission layer 370 is formed of a low molecular weight organic material or a high molecular weight organic material such as PEDOT (poly(3,4-ethylenedioxythiophene)). Further, the organic emission layer 370 may be formed of a multilayer including one or more of an emission layer, a hole injection layer HIL, a hole transport layer HTL, an electron transport layer ETL, and an electron injection layer EIL. The hole injection layer HIL may be disposed on the pixel electrode 191 that is the anode, and the hole transport layer HTL, the emission layer, the electron transport layer ETL, and the electron injection layer EIL may be sequentially laminated thereon.

The organic emission layer 370 may include a red organic emission layer emitting light having a red color, a green organic emission layer emitting light having a green color, and a blue organic emission layer emitting light having a blue color, and the red organic emission layer, the green organic emission layer, and the blue organic emission layer are respectively formed in a red pixel, a green pixel, and a blue pixel to display a color image.

Further, the organic emission layer 370 may display a color image using the red organic emission layer, the green organic emission layer, and the blue organic emission layer disposed in the red pixel, the green pixel, and the blue pixel respectively. A red color filter, a green color filter, and a blue color filter may be disposed for each pixel. Alternatively, a white organic emission layer emitting light having a white color may be formed in the red pixel, the green pixel, and the blue pixel. A red color filter, a green color filter, and a blue color filter may be formed for each pixel to display a color image. For the white organic emission layer, separate deposition masks for depositing a red organic emission layer, a green organic emission layer, and a blue organic emission layer in each pixel including a red pixel, a green pixel, and a blue pixel need not be used.

Alternatively, a white organic emission layer may be laminated to emit a white color. For example, the white organic emission layer may include at least one yellow organic emission layer and at least one blue organic emission layer to emit light having the white color. The white organic emission layer may include at least one cyan organic emission layer and at least one red organic emission layer to emit a white color. The white organic emission layer may include at least one magenta organic emission layer and at least one green organic emission layer to emit a white color.

When the common electrode 270 may be formed of a reflective conductive material, a rear surface light emission type of organic light emitting diode display is obtained. The reflective material may include, but is not limited to, lithium (Li), calcium (Ca), lithium fluoride/calcium (LiF/Ca), lithium fluoride/aluminum (LiF/Al), aluminum (Al), silver (Ag), magnesium (Mg), or gold (Au).

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. An organic light emitting diode (OLED) display comprising:
    a substrate;
    a scan line, formed on the substrate, and configured to transmit a scan signal;
    a data line and a driving voltage line intersecting the scan line and configured to transmit a data signal and a driving voltage, respectively;
    a switching transistor electrically coupled to the scan line and the data line and including a switching semiconductor layer and a switching gate electrode;
    a driving transistor electrically coupled to a switching drain electrode of the switching transistor and including a driving semiconductor layer and a driving gate electrode; and
    an organic light emitting diode (OLED) electrically coupled to a driving drain electrode of the driving transistor,
    wherein the data line and the driving voltage line are formed with different layers from each other and a distance between the driving semiconductor layer and the driving gate electrode is greater than a distance between the switching semiconductor layer and the switching gate electrode.

2. The organic light emitting diode (OLED) display of claim 1, wherein the driving gate electrode is formed at a different layer from the switching gate electrode.

3. The organic light emitting diode (OLED) display of claim 2, wherein the driving gate electrode and the data line are formed at the same layer.

4. The organic light emitting diode (OLED) display of claim 3, further comprising:
    a first gate insulating layer covering a semiconductor layer having the switching semiconductor layer and the driving semiconductor layer; and
    a second gate insulating layer formed on the first gate insulating layer,
    wherein the switching gate electrode is interposed between the first gate insulating layer and the second gate insulating layer, and
    wherein the driving gate electrode and the data line are formed on the second gate insulating layer.

5. The organic light emitting diode (OLED) display of claim 4, further comprising an interlayer insulating layer covering the driving gate electrode and the data line, and the driving voltage line is formed on the interlayer insulating layer.

6. The organic light emitting diode (OLED) display of claim 5, further comprising:
    a storage capacitor having a first storage capacitive plate, wherein the first storage capacitive plate is formed of substantially the same material of the semiconductor layer and the first storage capacitive plate is formed with the same layer as the semiconductor layer; and
    a second storage capacitive plate formed on the first gate insulating layer covering the first storage capacitive plate and overlapping the first storage capacitive plate, wherein the driving voltage line is connected to the second storage capacitive plate.

7. The organic light emitting diode (OLED) display of claim 6, wherein the first gate insulating layer is formed of a high dielectric constant material.

8. The organic light emitting diode (OLED) display of claim 7, wherein the high dielectric constant material includes HfOx, ZrOx, AlOx, or SiOx.

9. The OLED display of claim 1, wherein a second thickness of the second gate insulating layer is greater than a first thickness of the first gate insulating layer.

10. The OLED display of claim 4, wherein the first gate insulating layer constitutes a gate insulating layer of the switching transistor, and the first and second gate insulating layers constitute a gate insulating layer of the driving transistor.

11. The OLED display of claim 4, wherein the first gate insulating layer and the second gate insulating layer are in contact with each other under the driving gate electrode.

12. The OLED display of claim 1, wherein the semiconductor layer is continuously formed so that the switching semiconductor layer and the driving semiconductor layer are connected to each other.

* * * * *